United States Patent [19]

Takahashi et al.

[11] Patent Number: 4,894,489
[45] Date of Patent: Jan. 16, 1990

[54] ELECTROMAGNETIC SHIELD-TYPE DOORWAY FOR BUILDINGS AND ELECTROMAGNETIC SHIELDING SYSTEM THEREFOR

[75] Inventors: Takeshi Takahashi; Masatake Nakamura; Yoshiji Yabana; Toshiyuki Ishikawa; Koji Nagata, all of Tokyo, Japan

[73] Assignee: Shimizu Construction Co., Ltd., Tokyo, Japan

[21] Appl. No.: 52,635

[22] Filed: May 20, 1987

[51] Int. Cl.$^4$ ............................................. H05K 9/00
[52] U.S. Cl. .................................. 174/35 MS; 49/42; 49/68
[58] Field of Search ............... 174/35 MS; 49/42–45, 49/68, 70; 250/517.1

[56] References Cited

U.S. PATENT DOCUMENTS

| | | | |
|---|---|---|---|
| 2,050,584 | 8/1936 | Peremi et al. | 49/45 X |
| 2,599,944 | 6/1952 | Salisbury | 174/35 MS |
| 2,830,838 | 4/1958 | Drager | 49/68 X |
| 3,334,597 | 8/1967 | Ruskin et al. | 250/517.1 X |
| 4,069,618 | 1/1978 | Geiss | 174/35 MS X |

FOREIGN PATENT DOCUMENTS 61-35600  2/1986  Japan .

OTHER PUBLICATIONS

Pamphlet–Amerind Inc. Douglass, Pa.

Primary Examiner—Gerald P. Tolin
Assistant Examiner—David A. Tone
Attorney, Agent, or Firm—Armstrong, Nikaido, Marmelstein, Kubovcik & Murray

[57] ABSTRACT

An electromagnetic shield-type doorway for a building is provided with two doors having a curved passageway between them. By lengthening the passageway to such an extent that the two doors cannot be opened simultaneously, electric waves can be blocked at either of the doors. The electromagnetic shielding effect can be enhanced by installing a revolving door in the passageway and attaching electrically conductive brushes to at least the lower edge and one side edge of the revolving door to fill the gaps at these edges. In a system for electromagnetically shielding a building, a doorway passageway of the building is partitioned by three or more doorways each having an electromagnetic shielding function. When persons leaving and exiting a building simultaneously approach entrance and exit doors at the ends of the doorway passageway so that these doors open at the same time, the central doorway remains closed to maintain the integrity of the electromagnetic shield. If a large number persons are entering and exiting, the doors are opened and closed in an interlocked manner so that one of the three doorways will always be closed, thereby maintaining the integrity of the shield in reliable fashion without hampering entry and exit.

1 Claim, 3 Drawing Sheets

ELECTROMAGNETIC SHIELD-TYPE DOORWAY FOR BUILDINGS AND ELECTROMAGNETIC SHIELDING SYSTEM THEREFOR

BACKGROUND OF THE INVENTION

This invention relates to an electromagnetic shield-type doorway for buildings in which an entire building is provided with an electromagnetic shielding structure, which doorway is well-suited for application to an information network system utilizing electric waves. The invention also relates to an electromagnetic shielding system for such a doorway.

In many modern buildings, information generally is communicated between the interior and the outside of the building by making joint use of information communicating equipment such as multiple electronic exchanges and computers. With the increasing value of information, diversification of user needs with regard to information and increasingly individual nature thereof, how to transmit accurate information rapidly where large-scale buildings are involved has become of prime importance. In an effort to satisfy this need, data highway-type information networks utilizing optical fiber cables or coaxial cables have been studied and proposed.

However, with a data highway system utilizing optical fiber cables or coaxial cables, the cables must be stretched throughout all parts of the building. Extra time is needed to complete the work and additional expenses are required to lay these cables.

If electric waves are used to transmit information within the building, laying cables is unnecessary but radio law limits the usable frequency to no more than 3 T(tera) Hz owing to the emission of electrical noise waves from such a building. Another problem is that the communication system may malfunction due to electric waves from outside the building, television intermediate frequencies from inside the building, electric waves from wireless microphones, and the like.

Accordingly, in a building of the above type, the overall building is electromagnetically shielded, even at window openings and doorways, by using glass containing a mesh or glass to which an electrically conductive film has been affixed.

Merely providing the door at a doorway with an electromagnetic shielding structure does not make it possible to maintain a perfect electromagnetic shielding effect at all times since the door is opened whenever someone enters or leaves the building. At such times electric waves leak in from the doorway and impair those communications within the building that rely upon electric waves. Therefore, in a building the overall structure of which is electromagnetically shielded, it is essential that the shielding effect be maintained constantly even when a door is opened and closed.

In a case where a doorway employs a revolving door, providing the revolving door with an electromagnetic shielding property is an effective way to maintain a constant shield since the interior and exterior of the building are never opened to each other regardless of the angular position of the revolving door. However, in order to obtain smooth rotation in a conventional revolving door, a gap is provided along one longitudinal side edge and the lower edge of the door. As a result, electric waves leak through the gap whenever the revolving door is used. Thus, a satisfactory electromagnetic shield cannot be maintained at all times.

Though it has been contemplated to provide double automatic doors in order to solve the above problems, there are instances where both doors open simultaneously, as when one individual is entering while another is leaving at the same time. In such instances the integrity of the electromatic shield is not maintained.

SUMMARY OF THE INVENTION

An object of the present invention is to maintain a satisfactory electromagnetic shielding effect at all times by preventing the leakage of electric waves even when the door at a doorway is opened.

Another object of the present invention is to maintain a satisfactory electromagnetic shield at a revolving door without impairing the smooth rotation of the door.

A further object of the present invention is to reliably maintain an electromagnetic shield at a door even when individuals frequently enter and leave through the door.

According to the present invention, the foregoing objects are attained by providing two doors having a curved passageway in between. By lengthening the passageway, electric waves can be blocked at one door even if both doors are opened simultaneously. By using an electric wave absorbing material in the walls, floor and ceiling, electric waves leaking to the outside or penetrating the interior of the building when the doors are opened impinge upon and are attenuated by the walls, floor and ceiling of the passageway. Accordingly, a sufficiently high electromagnetic shielding performance can be obtained in the passageway from one door to the other. Moreover, by arranging the passageway to lie parallel to the body of the building, the protruding portion of the doorway can be minimized and space can be utilized effectively without waste.

In another embodiment of the invention, an electrically conductive brush is attached to at least the lower edge and side edge of a revolving door arranged in a doorway in order to fill the gaps at these edges. This improves the effectiveness of the electromagnetic shield and at the same time leaves the gaps possessed by the conventional revolving door so that the door will revolve smoothly without impediment. In addition, a revolving door having the same size as that of the conventional revolving door can be used. By installing an electric wave absorber in the walls, ceiling and floor surrounding the revolving door, electric waves blocked at the revolving door can be absorbed there, whereby the electromagnetic shielding performance is improved.

An electromagnetic shielding system for a building in accordance with the invention is characterized by partitioning a door passageway of the building by three or more doors each having an electromagnetic shielding function, wherein the central door remains closed even if the doors on both sides thereof are opened by individuals arriving at the doorway from both sides simultaneously. This makes it possible to maintain the integrity of the electromagnetic shield. By adopting an interlocked control technique in such a manner that one of the three doors is kept closed without fail even when a large number of people are entering and leaving, the integrity of the electromagnetic shield can be positively maintained without inconveniencing those using the doorway.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

Embodiments of the present invention will now be described with reference to the accompanying drawings.

Figure 1:
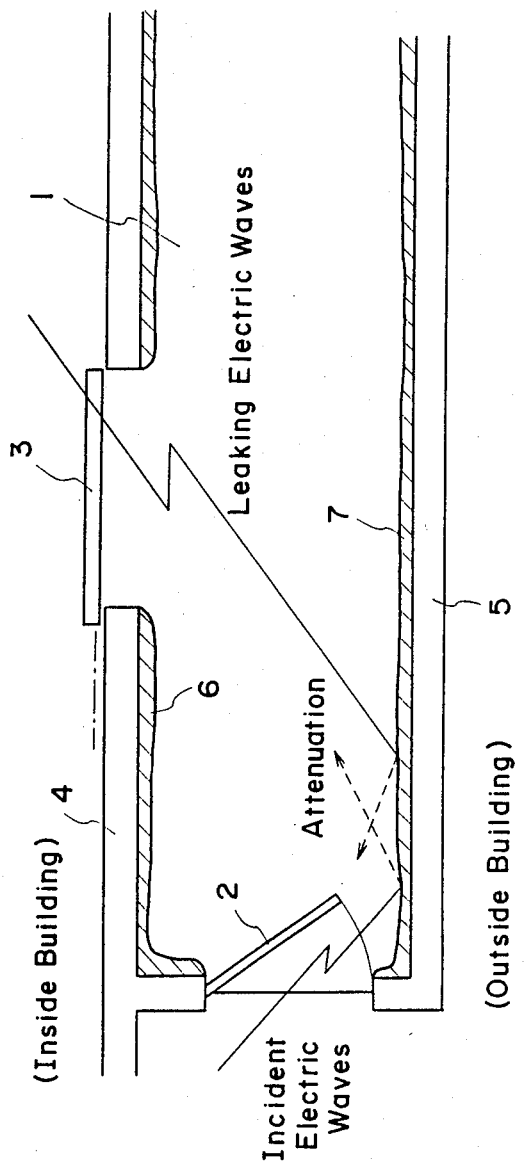
FIG. 1 is a view for describing an embodiment of an electromagnetic shield-type doorway for a building in accordance with the present invention.

FIG. 1 is a view for describing an embodiment of an electromagnetic shield-type doorway for a building in accordance with the invention.

In FIG. 1, a passageway 1 is arranged to lie parallel to a wall 4 of a building body. A door 2 is arranged in the passageway 1 on an end thereof leading to the outside of the building, and a door 3 is arranged in the passageway 1 in the side thereof corresponding to the wall 4 of the building body. Thus, the passageway starts at the door 2, curves at a right angle and leads to the door 3 to provide access to the interior of the building. Conversely, the passageway can be thought of as starting at the door 3, curving at a right angle and leading to the door 2 to provide access to the exterior of the building. In other words, the passageway 1 is curved. Though not shown, another door can similarly be provided at the right end of passageway 1 so that the two doors will occupy symmetrical positions with respect to the door 3. In the electromagnetic shield-type doorway of the present invention, the curving passageway 1 is arranged between the outer door 2 and inner door 3, and electric wave absorbers 6, 7 are used in the passageway walls 4, 5 and in the floor and ceiling of the passageway 1. Therefore, electric waves which enter the passageway from outside the building when the door 2 on the outer side of the building is opened impinge upon the wall 5, floor and ceiling of passageway 1 and are attenuated by the electric wave absorber 7. Similarly, electric waves which leak from the interior of the building when the inner door 3 is opened impinge upon the wall 5, floor and ceiling of passageway 1 and are attenuated by the electric wave absorber 7. The electric wave absorbers 6, 7 are adapted to absorb impinging electric waves without reflecting them, irrespective of the direction of arrival, polarization plane and frequency of the electric waves. Examples of these absorbers are dielectric absorbers using resistive films or carbon rubber, magnetic absorbers using ferrite, and absorbers which are a combination of dielectric and magnetic bodies.

Arranging the passageway 1 to lie parallel to the wall 4 of the building body as shown in FIG. 1 is advantageous in that the part which protrudes from the building is limited to the width of passageway 1 and enables the passageway 1 to be formed to any desired length. If the passageway 1 is long enough to allow one of the two doors to close before the other door is opened when an individual enters or leaves the building, the two doors will not be open simultaneously. Accordingly, the walls can be constructed of concrete containing a mesh or ferrite, and the doors can be constructed of glass containing a mesh or having an electrically conductive film affixed thereto. Such an electromagnetic shielding structure will provide a satisfactory electromagnetic shielding effect without requiring use of the aforementioned electric wave absorbers.

The present invention is not limited to the abovedescribed embodiment but can be modified in various ways. For example, the doors can be revolving doors, sliding doors or a combination thereof. In addition, the door shown in FIG. 1 can be arranged on the side of wall 5, and the portion of the passageway from door 2 to door 3 can be L-shaped.

Figure 2:
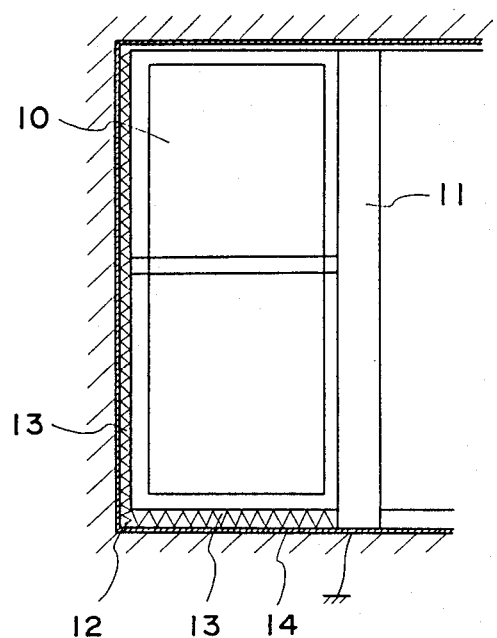
FIG. 2 is a sectional view illustrating an embodiment of an electromagnetic shield-type revolving door for a building in accordance with the present invention.

FIG. 2 illustrates another embodiment of the invention, in which the doorway is constituted by a revolving door 10. In order for the revolving door 10 to be revolved about a rotary shaft 11, its lower edge and one side edge are provided with a gap 12. Accordingly, even if the revolving door 10 proper is furnished with an electromagnetic shielding property by using mesh-containing glass or glass having an affixed electrically conductive film, electric waves can leak from the gap 12. As a result, the electromagnetic shielding effect is not satisfactory. Therefore, in accordance with the present invention, electrically conductive (metallic) brushes 13 are attached to the lower edge and one side edge of the revolving door 10 to fill the gap 12, thereby enhancing the electromagnetic shielding performance of the doorway. The electromagnetic shielding performance can be improved even further by electrically interconnecting the brushes 13 and grounding them at the rotary shaft 11.

If an electric wave absorber 14 is arranged in the walls, ceiling and floor at the periphery of the revolving door 10, electric waves are absorbed at the door periphery without reflection. This makes it possible to reduce electric waves blocked at the revolving door 10. Since the upper edge of the revolving door 10 generally has but a small gap, an electrically conductive brush is not necessarily required. However, if it is feared that the door may become deformed with long use, the upper edge should be furnished with the electrically conductive brushes just as the lower and side edges.

Figure 3:
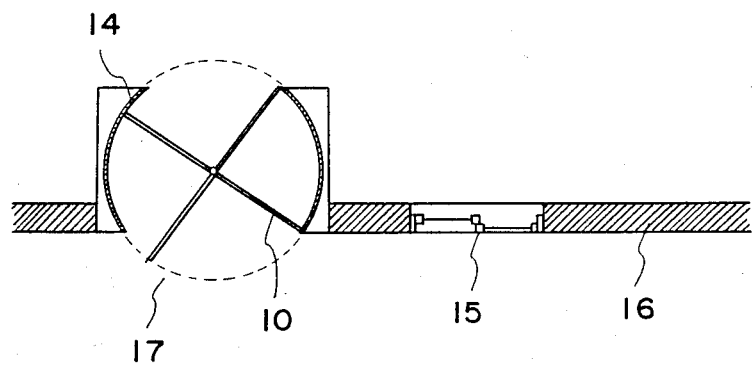
FIG. 3 is a plan view of the revolving door shown in FIG. 2.

FIG. 3 is a plan view of a doorway 17 using the revolving door shown in FIG. 2. The revolving door 10 and a window 15 are electromagnetically shielded by using glass containing a mesh or glass having an affixed electrically conductive film, electrically conductive (metallic) brushes are attached to the lower and side edges of the revolving door 10, and a body 16 of the building is constructed of mesh- or ferrite-containing concrete. With a building structure of this type, electric waves are blocked at the doorway 17, window 15 and body 16, so that the building is provided with an overall electromagnetic shield.

Figure 4:
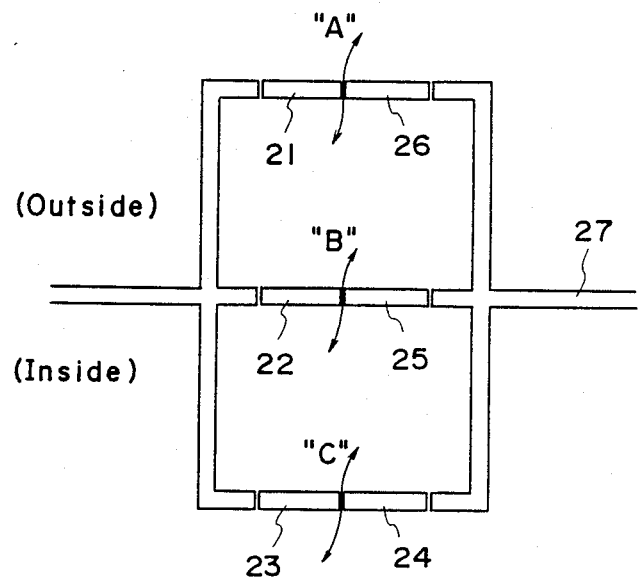
FIG. 4 is a plan view illustrating another embodiment of an electromagnetic shield-type doorway for a building in accordance with the present invention.

FIG. 4 illustrates an embodiment in which doorways have entrance doors 21, 22, 23 and exit doors 24, 25, 26. The doors 21–26 employ electrically conductive meshes or films, and a wall 27 consists of concrete containing ferrite, an electrically conductive mesh or the like.

Thus, the doors 21-26 and wall 27 each possess an electromagnetic shielding structure. When an individual enters the building (the lower side of the drawing) from the outside (the upper side of the drawing), this is sensed by sensors at the doors 21, 22, 23, in response to which the doors are opened automatically in the order mentioned. When an individual leaves the building in the direction opposite that mentioned above, this is sensed by sensors at the doors 24, 25, 26, in response to which the doors are opened automatically in the order mentioned. Accordingly, even if individuals enter and leave at the same time so that the doors at doorways A, C are opened simultaneously, the doors at the central doorway B will remain closed, thereby maintaining the integrity of the electromagnetic shield. It should be noted that if all of the doorways A, B, C have an entrance door or exit door open at the same time, the integrity of the electromagnetic shield cannot be maintained. Accordingly, in order to maintain the shield even if persons enter and leave the building in a continuous stream, the opening and closing of the doors shown in FIG. 4 is controlled in such a manner that any one of the doorways among the doorways A, B, C is always kept closed (i.e. such that if the other two doorways are open, the remaining doorway will not open).

Figure 5:
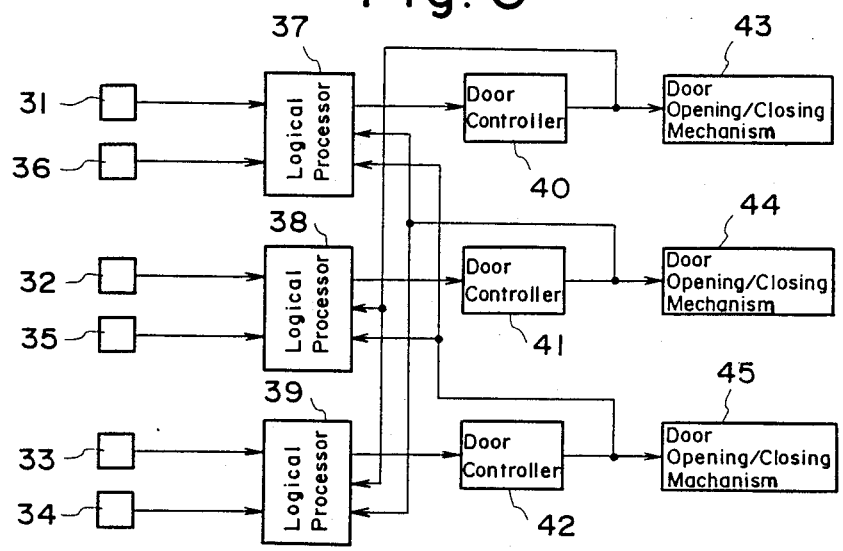
FIG. 5 is a view for describing an electromagnetic shielding system associated with the doorway of FIG. 4.

FIG. 5 is a view illustrating the construction of an embodiment of a control system for opening and closing the doors of the doorways. The system includes sensors 31-36, logical processors 37-39, door controllers 40-42, and door opening/closing mechanisms 43-45. The sensors 31-36 correspond to the doors 21-26 and sense persons entering and exiting through these doors. The logical processors 37-39 correspond to the doorways A, B, C and execute logical processing for opening and closing the doors in these doorways. The processors 37-39 make decisions regarding the opening and closing of the corresponding doors on the basis of signals from the sensors 31-36 indicative of persons entering and exiting and signals indicating the status of the doors (i.e. signals indicating whether the doors are open or closed). The aforementioned decision processing is performed as follows: If a person is sensed to be entering or exiting through a doorway, the status of entrance and exit doors at the other two doorways is checked. When at least an entrance door or exit door at each of the other two doorways is found to be open, the signal for opening the door of the first-mentioned doorway is inhibited. When all doors of least one of the other two doorways are found to be closed, the issuance of the aforementioned door opening signal is no longer inhibited and the door opening signal is sent to the corresponding door controller. The door controllers 40-42 receive the opening signals from the logical processors 37-39 and control the door opening/closing mechanisms 43-45, respectively. The door opening/closing mechanisms 43-45 are for opening and closing the entrance and exit doors 21-26, respectively.

The decision and control operations for opening and closing the doors will now be described in detail for a specific example of traffic through the doors. First, when a person entering from outside arrives at the front of door 21 in doorway A, the person is sensed by the sensor 31. If all of the doors 21-26 are in the closed state at this time, then the logical processor 37 provides the door controller 40 with a signal for opening the door 21 while the aforementioned person is being sensed. The door controller 40 responds to this door opening signal by controlling the door opening/closing mechanism 43 to open the door 21. When the signal vanishes, the controller 40 closes the door 21 in accordance with a predetermined sequence operation. The doors 22, 23 are controlled in the same manner when the person arrives in front of the doorways B, C, respectively.

If another person comes to the doorway A while the door 22 is open because of the arrival of the aforementioned person at doorway B, the door 21 of doorway A opens, just as described above. If a person exiting from the building should now arrive at the door 24 of doorway C, this is sensed by the sensor 34. In this case the logical processor 39 senses that the doors 21, 22 have been opened by the door opening/closing mechanisms 43, 44, respectively, and therefore does not yet provide the door controller 42 with a signal for opening the door 24. Accordingly, the logical processor 39 waits for either of the doors 21, 22 to close. In other words, the processor 39 sends the signal for opening door 24 to the door controller 42 on the condition that either door 21 or 22 is closed.

Next, assume that the signal for opening door 24 has been issued on fulfillment of the above condition, namely that door 22 be closed, whereby the door 24 is opened, and that the person entering arrives in front of door 23 at this moment upon having passed through door 22. In this case, the logical processor 39 provides the door controller 42 with a signal for opening the door 23 as well because both doors 22, 25 of doorway B are in the closed state. In this case, therefore, the door 21 in doorway A and the doors 23, 24 in doorway C are opened.

Thus, by way of the sensors 31, 36 corresponding to the doors 21, 26 of doorway A, the logical processor 37 monitors persons entering and exiting. The processor 37 also monitors the states of doors 22-25 in doorways B, C. Accordingly, if a person entering arrives in front of door 21 or a person exiting arrives in front of door 26, the signal for opening the door 21 or 26 is delivered on the condition that all of the doors in at least one of the other doorways B and C are closed. Delivery of the signal for opening door 21 or door 26 is inhibited on the condition that at least one of the doors is open in both of the doorways B and C. The logical processors 38, 39 operate in the same manner.

The invention is not limited to the above embodiment but can be modified in various ways. For example, in the above embodiment, the entrance and exit doors are provided separately. However, an arrangement can be adopted in which a single door serves as both an entrance and exit, or in which a shielding layer is provided between entrance and exit doors to greatly reduce the probability of three doors being opened simultaneously. Furthermore, the number of doorways is not limited to three; more than three can be provided. In addition, the door structure can be of the revolving type, sliding type or any other type. It also goes without saying that the doors and walls may have any electromagnetic shielding structure.

The inventors have separately proposed structures for electromagnetically shielding the outer wall surface composed of a building body and having openings for windows, entrances, exits and the like. These will now be described in brief. In one approach, the body of the building is constructed of concrete incorporating an electromagnetic shielding member. For example, this can be concrete containing a mesh or concrete mixed with ferrite. In another approach, the outer wall of a building is constructed of PC panels having an imbedded mesh, the mesh in the PC panels is electrically connected to building body fastening members, and the PC panels of upper and lower floors are electrically interconnected and grounded. In still another configuration, curtain walls fabricated using electromagnetic shielding members are fixed by anchor bolts to the building body via metal fasteners, electrically conductive cushions are affixed to the side faces of the curtain walls, and mutually adjacent curtain walls are electrically integrated to form an electromagnetic shielding space.

What is claimed is:

1. An electromagnetic shield-type doorway for a building in which electromagnetic shielding members are used to construct a body of the building and window and doorway openings to provide the overall building with an electromagnetic shielding structure, characterized in that electrically conductive brushes are attached to at least a lower edge and side edge of a revolving door arranged in said doorway, thereby filling gaps at said edges, said electrically conductive brushes being electrically interconnected and grounded at a rotary shaft of said revolving door and electrical wave absorbers are positioned around the periphery of said revolving door.

* * * * *